MULTI-LAYER PRINTED CIRCUIT BOARDS AND METHODS OF MAKING SAME

Filed July 22, 1969 2 Sheets-Sheet 1

INVENTORS
JOSEPH F. DEGNAN &
ROBERT A. AYOTTE

BY [signature]

MULTI-LAYER PRINTED CIRCUIT BOARDS AND METHODS OF MAKING SAME

INVENTORS
JOSEPH F. DEGNAN &
ROBERT A. AYOTTE

BY 3,649,475

MULTI-LAYER PRINTED CIRCUIT BOARDS AND METHODS OF MAKING SAME

Joseph F. Degnan, Webster, and Robert A. Ayotte, Rochester, N.Y., assignors to General Dynamics Corporation Filed July 22, 1969, Ser. No. 843,435
Int. Cl. C23b *5/48*; B44m *3/08*; B44d *1/18*
U.S. Cl. 204—15 7 Claims

ABSTRACT OF THE DISCLOSURE

A multi-layer printed circuit board for use in microwave frequency circuits is described. The board has at least a pair of printed circuit boards having polytetrafluorethylene substrates, one of which is single sided and the other of which is double sided. One circuit of the double sided board provides an internal layer of the multi-layer board. The outer layers form ground planes such that stripline circuits are provided for connection to microwave circuit components. The process includes steps for laminating the boards together providing plated through holes which permit polytetrafluorethylene to be used in a manner compatible with microwave circuit requirements.

The present invention relates to multi-layer printed circuit boards and methods of making same, and particularly to microwave or high frequency printed circuit boards having stripline circuits and methods of making such boards.

The invention is especially suitable for use in providing a circuit board wherein the circuits are etched on polytetrafluorethylene substrates to a high degree of precision so as to provide the electrical characteristics necessary for stripline circuits. Features of the invention, however, are applicable for manufacturing of multi-layer boards having precise spacing and void free laminations, as may be required with other substrate materials.

Polytetrafluorethylene, better known by the trade name "Teflon" which has been adopted by the E. I. du Pont de Nemours and Company, Inc. of Wilmington, Del., is a desirable substrate for stripline circuits. The trade name "Teflon" will be used hereinafter to designate this material. Unfortunately, it has not heretofore been possible to laminate successive layers of Teflon together in a manner to provide multi-layer boards of requisite precision for stripline circuitry. The adhesives, often chemically dissimilar to the substrate, which have been utilized did not provide a reliable bond or were incompatible with materials utilized to provide plated through holes, resulting in inferior hole plating. Accordingly, staked connections, say using rivets, were employed, together with other means for providing an additional mechanism for holding the boards together and to obtain shielding. Previous boards were therefore unsuitable for handling high voltages, since corona occurred in voids left during the lamination process. Another deficiency of prior boards was non-uniform spacing between the circuit planes. Thus, the yield rate of processes for manufacturing such boards was very low and their cost high.

It is an object of the present invention to provide improved multi-layer boards and methods of making same wherein the foregoing disadvantages and difficulties are substantially eliminated.

It is a still further object of the present invention to provide improved multi-layer printed circuit boards which may be constructed from circuits printed on Teflon substrates.

It is a still further object of the present invention to provide improved stripline multi-layer printed circuit boards.

It is a still further object of the present invention to provide methods of making multi-layer printed circuit boards wherein the circuit layers are precisely spaced and registered with respect to each other.

It is a still further object of the present invention to provide methods of making multi-layer printed circuit boards having Teflon layers together with plated through holes.

It is a still further object of the present invention to provide a method of making multi-layer printed circuit boards with Teflon laminations which have void free monolithic construction.

It is a still further object of the present invention to provide a method of making multi-layer printed circuit boards having Teflon laminations which withstand vibration even over a wide range of temperatures.

A still further object of the invention is to provide an improved technique for drilling holes through a multi-layer board which insures that the rings of conductive material in the holes are clean, thereby eliminating the need for removal of materials from other layers which may smear over the rings and especially for the removal of Teflon for which no suitable chemical removal technique is available.

A still further object of the invention is to provide an improved technique for preparing dissimilar surfaces, such as the adjacent layers of a through-hole in a multi-layer printed circuit board, for plating, so that the surfaces can be uniformly plated in a single process.

Briefly described, a multi-layer printed circuit board embodying the invention includes at least two printed circuit boards, one of which is single sided and the other which is double sided. The boards have substrates of Teflon. Both boards are initially copper cladded. The copper cladding is etched off the internal surface of one of the boards which is to become an inner layer of the multi-layer structure. A sheet of non-flowing B stage epoxy glass cloth is disposed between the inner surafces of the board and bonds the individual boards together upon lamination into a monolithic, void free, multi-layer structure. A pair of sheets, one of which is vinyl and the other a vinyl phenolic glass cloth material, may be disposed on the outer surfaces and laminated together with the structure. After lamination, holes are drilled through the structure. These holes are later plated to provide plated through hole connections between the circuits. The vinyl sheet laminates provide structural strength and prevent burring, crazing, or tearing during drilling, thereby helping to provide clean, internal rings. These masks also prevent undesirable plating or etching on exposed Teflon surfaces.

The Teflon boards and the epoxy glass cloth are laminated together via means which equalizes the pressure applied thereto, providing very precise spacing and precluding mis-registration of the circuit layers due to differential shear stresses which may occur during lamination. Bond strength is maximized through uniform glass-resin ratio retention, which insures uniformity of bonding film thickness, and provides controllable resin flow. Drilling of the plated through holes is accomplished with the aid of a cleaning material so as to prevent crazing or smearing of the Teflon over the printed circuit or epoxy material. After drilling, the holes are etched in two steps: firstly to treat the Teflon (viz. to coat it in a manner to accept deposit of a conductive coating), and secondly, to prevent any epoxy smear on internal copper rings which might reduce continuity of the printed circuit with the plating to be placed in the hole. After etch back, the conductive coating, say electroless copper, is deposited. The board then is plated to provide the plated through holes, and if required, additional circuitry is printed on the exposed outer area of the circuit side board.

The masks are removed in the course of the foregoing steps, such that the boards are completed and provide stripline circuits having plated through holes to which microwave components, such as microwave tubes, may be connected.

The invention itself, both as to its organization and method of operation as well as additional objects and advantages thereof, will become more readily apparent from the reading of the following description in connection with the accompanying drawings in which.

Figure 1:
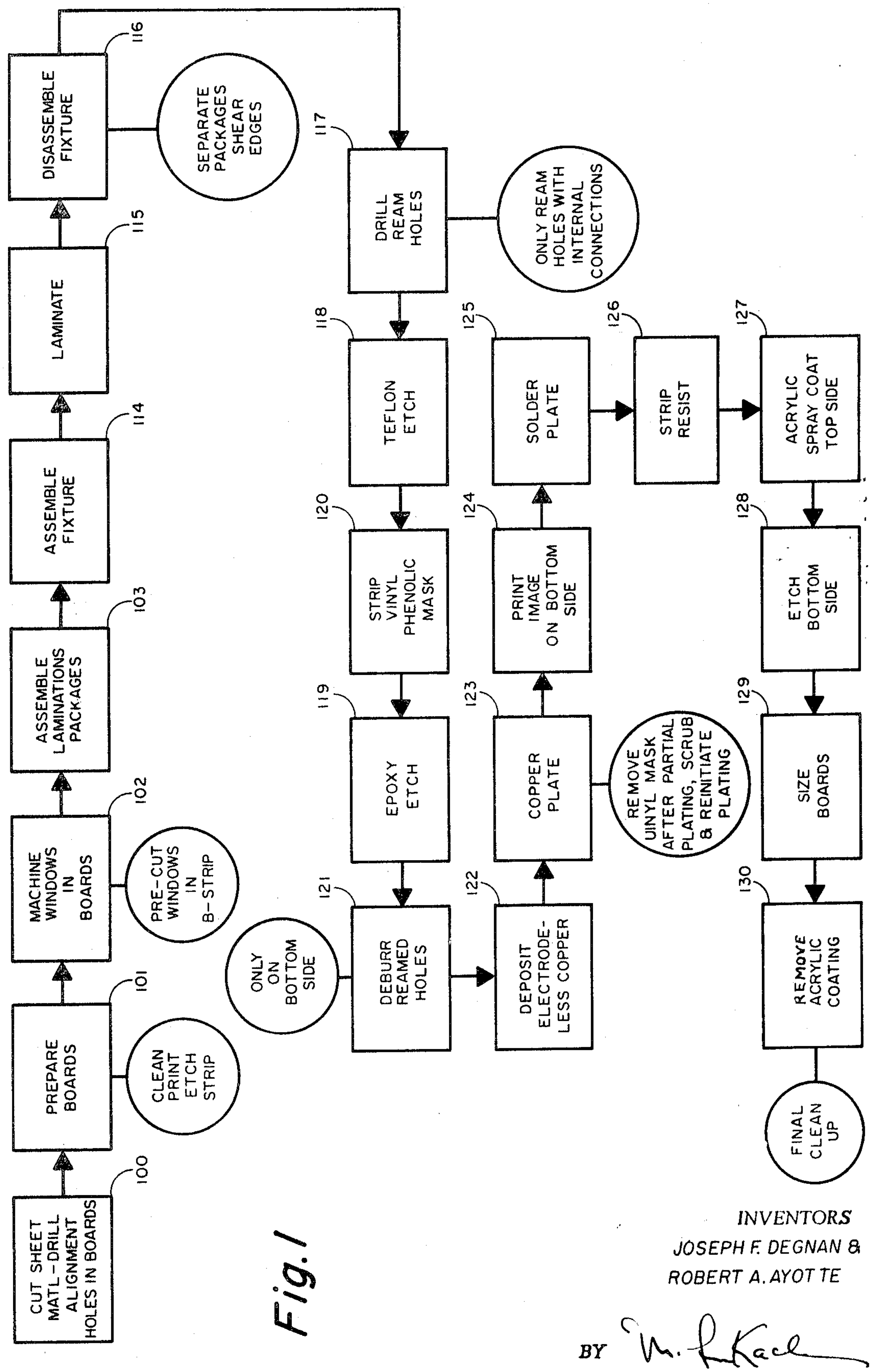
FIG. 1 is a flow chart illustrating the steps in a process for making multi-layer printed circuit boards in accordance with the invention.

Referring to FIG. 1, there is depicted the sequence of steps which is performed in accordance with the invention for the fabrication of multilayer Teflon printed circuit boards consisting of two or more discrete Teflon substrates with plated through holes as the interconnection media. In the first step 100 of the process, the circuit boards and sheets which are to be laminated together are cut into blanks of suitable size. In the event that the circuit boards to be fabricated are small, the blanks may be of sufficient size to accommodate several boards, say 6 boards, one by two inches each per blank.

Figure 2:
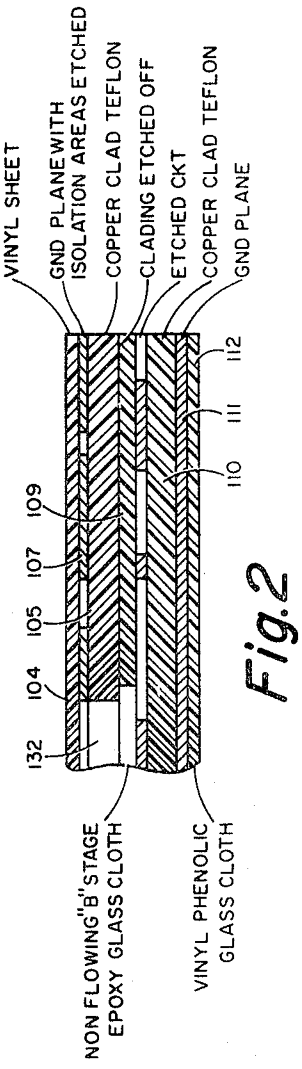
FIG. 2 is a sectional view illustrating a package of the individual boards and sheets which upon lamination forms the invention.
Figure 3:
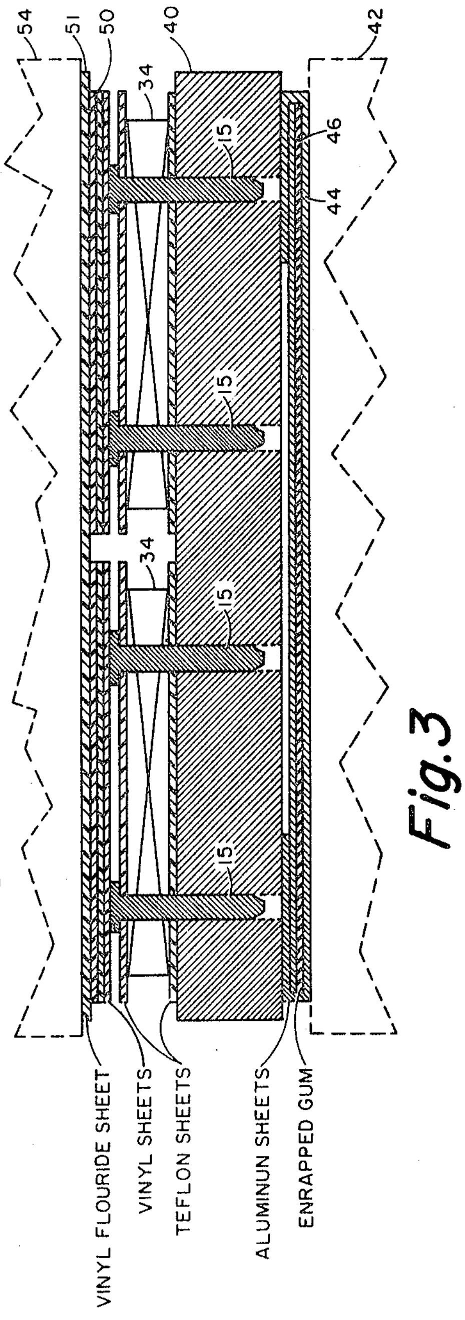
FIG. 3 is a sectional view of a lamination fixture used to laminate the package shown in FIG. 2.

Alignment holes are drilled in the Teflon board which will receive alignment pins for assembly thereof into the fixture. These alignment pins 15, four to a blank, are shown in FIG. 3. The index holes may be punched in the other sheets which are to be laminated together with the boards. The blank Teflon boards are copper clad on both sides. The thickness of the copper clad material may for example be about 0.31 in. Two Teflon boards are used to make each multi-layer board. The other materials used will be described in connection with the lamination packages shown in FIG. 2.

In the next step 101, the boards are prepared, by which is meant that circuits patterns are provided thereon. In this course of board preparation, they are cleaned, photo resist is applied thereto, circuits are printed thereon, developed, etched and the photo resist stripped with a suitable solvent. The copper cladding is etched away from the entire surface of one of the boards which is to be disposed on the inside of the laminated multilayer board. It has been found in accordance with this invention that, although Teflon may not be laminated with a dissimilar bonding material, such as epoxy glass, a Teflon surface which has been clad with copper and from which the copper has been etched away will accept lamination and bonds exceedingly well without voids or wrinkles, when a bonding medium of substantially non-flowing properties which retains high resin content, such as non-flowing B stage epoxy glass is used.

In the next step 102, cutouts such as windows and holes are machined in the boards. Desirably, a drill is used for the holes and a drill mounted on a pantograph is used to make the cutouts. The laminating material (viz., the B stage epoxy glass cloth) is also provided with cutouts as required. Desirably, these cutouts should be cut back slightly, say 1/32 in. from the corresponding cutout areas in the mating cover board.

In the next step 103, the lamination packages 34 are assembled. FIG. 2 shows one of the packages 34. A number of these packages 34 can be assembled on the pins 15 before the pins are inserted together with the assembled packages thereon into holes in a base plate 40 of the lamination fixture (see FIG. 3). While two sets of packages per fixture are shown assembled on the pins 15 in FIG. 3, it may be desirable to provide a greater number of packages in each group, say from one package to four packages. The packages are separated by Teflon sheets 36 from the flanges of the pin 15, from the surface of the base plate 40, and from each other to permit the packages 34 to be readily separated after lamination.

The packages 34 themselves include a sheet 104 of vinyl material, which may be a film 0.020 in. thick. The circuit board 105 is next. This board will be referred to as the cover board. A circuit layer 107 which provides a ground plane is etched on the outer side of the board. The other surface of the board has been etched free of copper, as was explained above. The next layer is a sheet 109 of non-flowing B stage epoxy glass cloth which provides the bonding agent during the lamination process. This sheet is desirably a woven glass fiber pre-impregnated with a non-flowing epoxy resin having a high inter-laminar bond strength. Resin content may be from 65% by weight to 55% by weight. Volatile content should be very low, say 0.5% by weight maximum. It should have limited controlled flow (e.g., 1/64 inch on edges) and a rapid gel time, say less than 30 seconds. Inasmuch as this material has no significant flow, it does not give rise to shear stresses caused by flow during the lamination process. This preserves registration among the boards (viz. the cover board 105 will not slip laterally with respect to the bottom circuit board 110). This preserves the axial alignment of the drilled holes with the pads on the printed circuits. Moreover, the non-flowing material when laminated under conditions of equalizing pressure provides very precise spacing between the circuit layers, as is necessary for strip line circuitry. The circuit board 110 is copper clad on both sides. The inner side is etched while the outer side is not etched. A circuit is provided on the outer side, if required, in the latter stages of the process. Inasmuch as this outer side is not etched, it provides good electrical continuity for the plating of drilled holes. However, the copper cladding 111, which as noted above is not etched, may be etched in the step 101 of the preparation of the board, if desired. The lowermost layer is a sheet 112 of vinyl phenolic glass cloth, say 0.004 in. in thickness. It desirably has a resin content of 35% by weight and a volatile content of 4% to 7.5% by weight. The vinyl sheet 104 over the cover board and the vinyl phenolic glass cloth sheet 112 on the under side of the board serve as masks to facilitate drilling and reaming quality of the plated through holes and to prevent damage to the boards during etching, and also to prevent unwanted deposition of electrodeless copper on exposed Teflon during pre-plating, principally in the cutout areas.

Referring to FIG. 3, one fixture is shown after completion of the step 114 of assembly. Lamination is done in a press; the platens 42 and 54 of which are shown in FIG. 3. A bag 44 containing an elastometric gum material 46, which flows within bag confines under heat and pressure, is disposed between the platen 42 and the bottom of the base plate 40. The gum material may be of the type sold under the trade name "Press-To-Flo" by the Bloomingdale Rubber Division of American Cyanimid Company. Above the flanges of the pins 15 there are placed three sheets 50 of vinyl material (the same material as sheet 104). These sheets of vinyl film, say .020 inch thick, are placed over both sets of packages prior to lamination. A sheet 51 of vinyl fluoride film material, which prevents adhesion of the vinyl sheets 50 to the platen 54, is provided. The gum material and the vinyl sheets 52 flow under pressure and provide uniform conformal pressure during lamination. It has been found that the use of the pressure equalizing means of the entrapped gum and the vinyl sheets provided an improvement over conventional rigid pressure application systems and permits lamination without voids and of precise bonding film thickness in spite of the fact that the B stage epoxy glass cloth 109

(FIG. 2) is non-flowing, plus allowing the use of lower laminating pressures which reduce resultant lamination stresses. The aluminum bag also slows heat transfer and provides additional time for fixturing and loading before closing the press.

In the step 115 of laminating, the platens are first heated to about 325° F. The press is then closed under no load. While the press is so closed (dwell time), the temperature of the plate 40 is measured, say with a surface pyrometer. When this edge temperature reaches 200° F., pressure is applied slowly until it reaches about 200 p.s.i. A loading time is desirably from 5 to 10 seconds. Pressure and heat is applied for 40 min. The pressure is continued after the heat is turned off and the heat is allowed to fall to about 100° F. Then the pressure is removed, and the fixture is removed from the press. A post-cure step has been found not to be necessary by virtue of the fact that lamination techniques impart a minimal laminate stress. The use of B stage material also permits lamination to be controlled readily by means of control of the fixture plate 40 temperature and avoids reliance on the skill of the operator to observe the flow and polymerization characteristics of the adhesive, which is the case when flowable materials are used.

In the next step 116, the fixture is disassembled by peeling off the vinyl 50 and vinyl fluoride sheets 51 from the top of the packages and knocking out the pins 15 in an arbor press. The packages are separated by means of the Teflon sheet spacers 36.

In the next step 117, the holes, which are to be plated through, are drilled and some of the holes are reamed. Since the mask 104 becomes visually transparent after lamination, drilling can be done by eye (viz. without special indexing). It has been found in accordance with the invention that reaming with a cleaning material serving as a lubricant prevents smear of the Teflon over the circuit layers (particularly the annular rings of copper in the holes) which would otherwise preclude good continuity to the circuits via the plated through holes. Drilling is followed with reaming, but only those holes with internal connections are desirably reamed. Prior to each down stroke of the reaming tool a lubricant, preferably a pure soap such as Ivory soap sold by the Procter and Gamble Company has been found especially suitable as a lubricant. The vinyl and vinyl phenolic sheets 104 and 112 insure that there will be no burrs formed during drilling or reaming and prevents tearing or other damage to the ground plane layers on the upper and bottom surfaces of the cover board 105 and the bottom board 110, respectively. Desirably, the reamer is made of tungsten carbide material. Desirably, also the down stroke is from the vinyl sheet 104 towards the vinyl phenolic sheet 112 which serves as a backer and insures clean cutting of the copper material on the down stroke while preventing smear and gouging, providing high quality smooth holes with clean internal rings.

Etching of the plated through holes is accomplished in two steps 118 and 119. In the first step 118, the Teflon material is etched, while in the next step, the epoxy is etched back. The etching steps provide clean plated through holes with exposed annular rings and whole surfaces which accept the deposition of an electrodeless copper conductive coating. The Teflon etch is a sodium naphthalate salt solution. The solution sold under the name "Tetra-Etch" by W. L. Gore Company of Newark, Del., will be suitable. The epoxy etch is accomplished by utilizing an epoxy etchant of concentrated 98% sulphuric acid which is rinsed off in hot water. It is desirable to strip the mask after the Teflon etch 118 as sulphuric acid will clean the copper surface. This may be accomplished by immersing the board in hot water, say 200° F., for a few minutes, and thereafter peeling off the vinyl phenolic mask. The mask stripping step also serves the purpose of washing off the sodium naphthalate solution.

After etching, comes the step 121 of the deburring of any of the reamed holes in the outer circuit cover surface of the layer 111 which may appear. This may be done by a rounded glass stirring rod mounted in a drill. This deburring is generally limited to reamed holes only.

Figure 4:
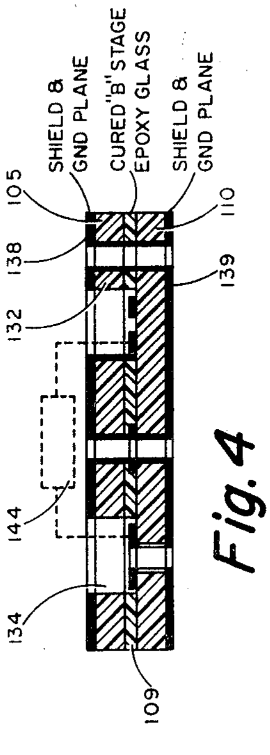
FIG. 4 is a sectional view, the section being taken along the line 4—4 of FIG. 5 showing a multi-layer printed circuit board embodying the invention which is constructed in accordance with the process depicted in FIG. 1.

After deburring, electrodeless copper is deposited in the next step 122. This provides a conductive coating over the inner surfaces of all of the holes. The vinyl mask 104 prevents undesirable deposition of conductive material on exposed Teflon substrate areas, say in the areas 132, 134 (FIG. 4). The following step 123 is electrolytic plating, say in a copper pyrophosphate plating bath. Contact may be made to the ground plane layer 111 for good plating continuity. Inasmuch as removal of the vinyl mask 104 prior to plating could strip away some of the electrodeless copper coating, it is desirable to stop the plating process after some copper has deposited and after the copper has sufficient strength to stand alone and then removing the vinyl mask. This may be accomplished merely by peeling the mask off the boards. After the mask is removed, the boards are scrubbed thoroughly with a brush and scrubbing compound. The boards are then replaced into the baths and plating continues. Plating may take place, for a six inch by eight inch blank, at 9 amps current for 15 minutes prior to mask removal and for an additional 45 minutes at 17 amps after the mask has been removed.

The next step 124 involves the application of the circuit pattern to the layer 111 by means of silk screening on a suitable solder resist. After this step, a solder plating step 125 is accomplished. In the next step 126, the resist is stripped with a suitable solvent.

Next a spray coating of fast-drying acrylic resin is applied, but only to the top side (viz. over the ground plane layer 107). It should be noted that the edges of the board may be plated to provide an edge shield, suitably when boards are dimensioned to size prior to plating. In other words, an electrodeless copper deposit is applied to the edges in step 122 which is plated in step 123 and then solder plated in step 125. Acrylic spray coating may cover the sides, as well as the surface of the layer 107.

In the next step 128, the bottom layer 111 is etched to provide the circuit thereon. After the etchant is cleaned, the boards are cut to size in step 129. The acrylic coating is then stripped in step 130 by immersing in a hydrocarbon solvent material, such as "Freon TMC" sold by E. I. du Pont de Nemours. The boards are then touched up and cleaned and are available for use.

Figure 5:
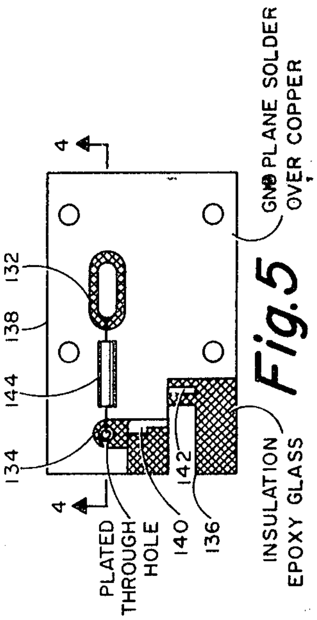
FIG. 5 is a plan view of the board shown in FIG. 4.

FIGS. 4 and 5 illustrate a typical board after it is completed. The cover board 105 and the bottom board 110 are illustrated. It will be noted how the B stage sheet 109 bonds these boards together. The cutouts 132 and the hole 134 which are precut in the boards are also illustrated. Note also the notch 136 which is precut in the lower board 110. The circuits 138 and 139 on the exterior surfaces of the boards 105 and 110 are substantially continuous and provide shield and ground planes so that the circuit board is operable as a strip line. Connection may be made for transmission of microwave energy to the boards. For example, a microwave tube may be connected to the extensions 140 and 142 of the inner circuit provided on the uppermost side of the lower board 110. An element such as a choke 144 may be connected via the cutouts and hole 132 and 134. Connections may also be made to the circuits via the cutouts.

From the foregoing description it will be apparent that there has been provided an improved stripline multi-layer printed circuit board which is provided from circuit boards having Teflon substrates. While a preferred process and circuit board configuration has been described, it will be appreciated that variations and modifications thereof within the scope of the invention or utilizing the features thereof will undoubtedly suggest themselves to those skilled in the art. Accordingly, the foregoing description should be taken merely as illustrative and not in any limiting sense.

What is claimed is:

1. A method of making a multi-layer strip line printed circuit board using a pair of boards having Teflon substrates, each of which boards is clad with conductive material on both surfaces thereof which comprises the steps of removing the conductive material from the inner surface of the first of said pair of boards, providing circuits on the inner surface of the second of said pair of boards then laminating the inner surfaces of said first and second boards together with a sheet of substantially non-flowing B stage epoxy glass cloth therebetween, drilling holes through said laminated boards, and making plated connections to said circuits and said cladding via said holes.

2. The invention as set forth in claim 1 including the steps of applying masks of vinyl material on the outer surfaces of said first and second boards prior to said laminating step and then laminating said vinyl mask material to said outer surfaces during said laminating step, and removing said masks after said step of making plated-through connections.

3. The invention set forth in claim 2 wherein one of said masks is vinyl and the other is vinylphenolic whereby the masks are selectively removable, the vinyl mask being transparent after lamination and drillable, thereby facilitating hole positioning during drilling and preventing deposition of conductive material on the outer surface of one of the laminated boards.

4. The invention set forth in claim 3 wherein said holes are drilled so as to intersect two dissimilar materials (Teflon and epoxy), and including the step of fabricating openings in one of said boards and corresponding openings in said epoxy glass cloth prior to lamination whereby to provide access to circuits internal of the multilayer board formed after lamination.

5. The method of making a multi-layer printed circuit board from a plurality of circuit boards, each having a Teflon substrate comprising the steps of laminating said boards together with a layer of substantially non-flowing B stage epoxy glass cloth therebetween, drilling holes through said boards, intersecting said circuits thereon, said drilling being accomplished with the aid of a lubricant, etching said holes to provide clean annular rings where the circuit layers intersect said holes, said etching being accomplished in a first step of immersing said boards in a solution which is adapted to etch the Teflon material, and then immersing said boards in a solution which is adapted to etch the epoxy glass material, depositing a coating of conductive material on said boards, and thereafter plating the dissimilar composite materials constituting said laminated boards electrolytically.

6. The invention set forth in claim 5 wherein said plating step is adapted to apply a copper plating over the conductive material deposited on said board, and including the step of printing an image which will accept copper plating on at least one side of said board and then solder plating over said image.

7. The invention set forth in claim 6 including the steps of applying a coating of acrylic resin material to the surface of said board which is not solder plated, immersing said solder plated surface in a copper etchant so as to remove the copper in the area which is not solder plated, thereby to provide a solder plated circuit over a surface of said board.

References Cited

UNITED STATES PATENTS

| | | | |
|---|---|---|---|
| 3,301,939 | 1/1967 | Krasnow | 204—15 |
| 3,433,888 | 3/1969 | Tally et al. | 174—68.5 |
| 3,499,218 | 3/1970 | Dahlgren et al. | 204—15 |
| 3,508,330 | 4/1970 | Kubik | 117—212 |
| 3,509,624 | 5/1970 | Boucher | 117—212 |

JOHN H. MACK, Primary Examiner

T. TUFARIELLO, Assistant Examiner

U.S. Cl. X.R.

29—625; 117—212; 156—3, 250; 174—68.5